United States Patent
Lin et al.

(10) Patent No.: US 11,899,976 B2
(45) Date of Patent: Feb. 13, 2024

(54) SOLID STATE STORAGE DEVICE AND WRITE CONTROL METHOD WITH DIFFERENT WRITE MODES THEROF

(71) Applicant: SOLID STATE STORAGE TECHNOLOGY CORPORATION, Taipei (TW)

(72) Inventors: Liang-You Lin, Taipei (TW); Yu-Chuan Peng, Taipei (TW); Ya-Ping Pan, Taipei (TW); Po-Yen Chen, Taipei (TW)

(73) Assignee: SOLID STATE STORAGE TECHNOLOGY CORPORATION, Taipei (TW)

( * ) Notice: Subject to any disclaimer, the term of this patent is extended or adjusted under 35 U.S.C. 154(b) by 87 days.

(21) Appl. No.: 17/678,067

(22) Filed: Feb. 23, 2022

(65) Prior Publication Data
US 2023/0195384 A1   Jun. 22, 2023

(30) Foreign Application Priority Data
Dec. 21, 2021   (TW) .................................. 110147917

(51) Int. Cl.
*G06F 3/06*   (2006.01)
(52) U.S. Cl.
CPC .......... *G06F 3/0659* (2013.01); *G06F 3/0604* (2013.01); *G06F 3/0679* (2013.01)
(58) Field of Classification Search
CPC ..... G06F 3/0659; G06F 3/0604; G06F 3/0679
See application file for complete search history.

(56) References Cited

U.S. PATENT DOCUMENTS

| | | | |
|---|---|---|---|
| 8,886,911 B2 | 11/2014 | Nemazie et al. | |
| 10,614,888 B2 | 4/2020 | Igahara et al. | |
| 10,650,886 B2 | 5/2020 | Natarajan et al. | |
| 2018/0211708 A1* | 7/2018 | Igahara | G11C 16/105 |
| 2019/0347197 A1* | 11/2019 | Lee | G06F 12/0253 |
| 2020/0019497 A1* | 1/2020 | Na | G06F 3/0689 |
| 2020/0285407 A1* | 9/2020 | Lee | G06F 3/0656 |
| 2020/0393995 A1* | 12/2020 | Jung | G06F 1/3225 |
| 2021/0064249 A1* | 3/2021 | Mehta | G06F 11/1048 |
| 2021/0157722 A1* | 5/2021 | Jang | G06F 11/3419 |
| 2022/0043604 A1* | 2/2022 | Kurita | G06F 3/0679 |
| 2022/0066648 A1* | 3/2022 | Gunda | G11C 11/5635 |
| 2022/0300172 A1* | 9/2022 | Kurita | G06F 3/0625 |

\* cited by examiner

*Primary Examiner* — Tasnima Matin
(74) *Attorney, Agent, or Firm* — WPAT, P.C

(57) ABSTRACT

A solid state storage device includes a control circuit, a volatile memory and a non-volatile memory. The non-volatile memory is divided into a first area and a second area. After the host issues a write command and a write data, the control circuit monitors a data amount of the write data continuously stored into the non-volatile memory. Before the data amount of the write data continuously stored into the non-volatile memory reaches a predetermined amount, the write data is stored into plural buffering blocks of the first area in a first write mode. After the data amount of the write data continuously stored into the non-volatile memory reaches the predetermined amount, the write data is stored into plural storing blocks of the second area in a second write mode.

9 Claims, 5 Drawing Sheets

SOLID STATE STORAGE DEVICE AND WRITE CONTROL METHOD WITH DIFFERENT WRITE MODES THEROF

This application claims the benefit of Taiwan Application No. 110147917, filed Dec. 21, 2021, the subject matter of which is incorporated herein by reference.

FIELD OF THE INVENTION

The present invention relates to a control method for a solid state storage device, and more particularly to a solid state storage device and a write control method for the solid state storage device.

BACKGROUND OF THE INVENTION

As is well known, a solid state storage device is a data storage device that uses a non-volatile memory to store data. After data are written into the non-volatile memory, if the system is powered off, the data are still retained in the solid state storage device.

FIG. 1 is a schematic functional block diagram illustrating the architecture of a conventional solid state storage device. As shown in FIG. 1, the solid state storage device 100 comprises a control circuit 110, a volatile memory 130 and a non-volatile memory 120. The control circuit 110 is connected to the volatile memory 130 and the non-volatile memory 120. For example, the volatile memory 130 is a dynamic random access memory (DRAM) or a static random access memory (SRAM). That is, when the system is powered off, the contents stored in the volatile memory 130 are lost.

The control circuit 110 is in communication with a host 12 through an external bus 20. Consequently, commands and data can be exchanged between the control circuit 110 and the host 12. For example, the external bus 20 is a USB bus, a SATA bus, a M.2 bus, a PCIe bus, or the like. The volatile memory 130 can be directly installed in the control circuit 110.

When the host 12 intends to store a write data into the solid state storage device 100, the host 12 issues the write command to the control circuit 110 of the solid state storage device 100. Then, the control circuit 110 receives the write data from the host 12, and the write data is temporarily stored into the volatile memory 130. Moreover, the write data in the volatile memory 130 is stored into the non-volatile memory 120 by the control circuit 110.

Generally, the non-volatile memory 120 comprises plural blocks, for example 1024 blocks. Each block comprises plural pages, for example 64 pages. Each page is typically 16 Kbyte in size. That is, the capacity of each block is 1 Mbyte. It is noted that the number of the blocks in the non-volatile memory 120 is not restricted to 1024. Moreover, the number of pages in each block and the size of each page can be determined by the manufacturer of the non-volatile memory 120. That is, the number of pages in each block is not restricted to 64, and the size of each page is not restricted to 16 Kbyte.

Due to the inherent properties of the non-volatile memory 120, at least one page is written by the control circuit 110 during the program action, and the erase operation is performed by the control circuit 110 in a block-wise fashion.

For example, the size of each page is 16 Kbyte. When a write data in the volatile memory 130 is stored into the non-volatile memory 120, the write data is divided into plural sub-write data, wherein each sub-write data has the size of 16 Kbyte (i.e., the size of one page). These sub-write data are written into plural pages of an open block of the non-volatile memory 120. After all pages of the open block store the write data, this open block is set as a closed block. At the same time, the control circuit 110 selects a blank block of the non-volatile memory 120 as an open block. In addition, the write data is continuously stored into at least one page of the open block. In other words, the blank block is an available block that is selectively used by the control circuit 110.

When the total storage data amount of the non-volatile memory 120 reaches a threshold amount, a garbage collection is performed by the control circuit 110. During the program operated, plural invalid pages are generated by the non-volatile memory 120. The invalid pages are distributed in many blocks. In other words, plural blocks will contain both invalid pages and valid pages exist in at the same time, wherein the data stored in the invalid pages are the invalid write data, and the data stored in the valid pages are valid write data. When the garbage collection is performed, the write data of the valid pages of the closed blocks are copied to another blank block by control circuit 110. After the write data of the valid pages in the closed block are copied completely, the closed block is erased as a new blank block so as to be used again.

Generally, when the garbage collection is performed, the control circuit 110 spends a lot of time in searching the closed block and copying the write data. If the control circuit 110 receives the write command or the read command from the host 12 while the garbage collection is performed, the performance of the solid state storage device 100 is largely impaired.

Depending on the number of bits to be stored in the memory cell, the non-volatile memory 120 may be classified into two types, i.e., a single-level cell (SLC) type non-volatile memory and a multi-level cell (MLC) type non-volatile memory. The memory cell of the SLC type non-volatile memory can store only one bit of data per cell. The memory cell of the MLC type non-volatile memory can store plural bits of data per cell. The MLC type non-volatile memory can store more data than the SLC type non-volatile memory. However, the accessing speed of the SLC type non-volatile memory is faster.

Since the price of the MLC type non-volatile memory is relative low, the MLC type non-volatile memory is usually used as the non-volatile memory cell 120 in the commercially available solid state storage devices 100. However, since the accessing speed of the solid state storage device 100 with the MLC type non-volatile memory is slow, the performance of the solid state storage device 100 is deteriorated.

Therefore, there is a need of providing an improved solid state storage device while retaining the advantage of the MLC type non-volatile memory (e.g., high storage capacity) and maintaining the acceptable writing performance.

SUMMARY OF THE INVENTION

The present invention provides a solid state storage device and a write control method for the solid state storage device. By the write control method of the present invention, the writing performance of the solid state storage device is enhanced.

An embodiment of the present invention provides a solid state storage device. The solid state storage device is connected with a host. The solid state storage device includes a control circuit, a volatile memory and a non-volatile memory. The control circuit is connected with the host. The volatile memory is connected with the control circuit. The non-volatile memory is connected with the control circuit. The non-volatile memory is divided into a first area and a second area. After the host issues a write command and a write data, the control circuit monitors a data amount of the write data continuously stored into the non-volatile memory. Before the data amount of the write data continuously stored into the non-volatile memory reaches a predetermined amount, the write data is stored into plural buffering blocks of the first area in a first write mode. After the data amount of the write data continuously stored into the non-volatile memory reaches the predetermined amount, the write data is stored into plural storing blocks of the second area in a second write mode. A write speed in the first write mode is faster than a write speed in the second write mode. When a total storage amount of the first area reaches a threshold amount, the control circuit performs a garbage collection on the first area. The predetermined amount is smaller than the threshold amount.

Another embodiment of the present invention provides a write control method for a solid state storage device. The solid state storage device includes a volatile memory and a non-volatile memory. The non-volatile memory is divided into a first area and a second area. The write control method includes the following steps. In a step (a), the solid state storage device is in a standby state when no command from a host is received. In a step (b), when a write command from the host is received, a write data from the host is temporarily stored into the volatile memory. In a step (c), the write data is stored from the volatile memory into the non-volatile memory, and the step (a) is performed again. The step (c) includes the sub-steps (c1), (c2) and (c3). In the sub-step (c1), a data amount of the write data continuously stored into the non-volatile memory is monitored. In the sub-step (c2), before the data amount of the write data continuously stored into the non-volatile memory reaches a predetermined amount, the write data is stored into plural buffering blocks of the first area in a first write mode. In the sub-step (c3), after the data amount of the write data continuously stored into the non-volatile memory reaches the predetermined amount, the write data is stored into plural storing blocks of the second area in a second write mode. A write speed in the first write mode is faster than a write speed in the second write mode.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a solid state storage device and a write control method for the solid state storage device. In accordance with the feature of the present invention, the write data is stored into the multi-level cell (MLC) type non-volatile memory in a single-level cell (SLC) write mode. Consequently, the writing performance of the solid state storage device is enhanced. In this context, the multi-level cell (MLC) is the memory cell capable of storing a multi-bit data. The bit number of the data to be stored in the memory cell is not restricted. With the development of the non-volatile memory manufacturing technology, the multi-level cell can store the data of two bits, three bits, four bits, or more than four bits.

Figure 1:
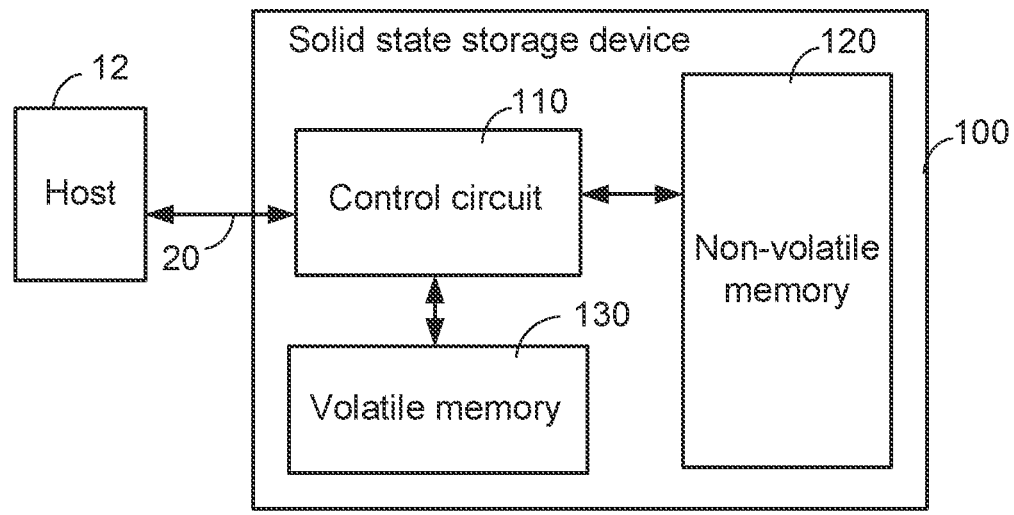
FIG. 1 (prior art) is a schematic functional block diagram illustrating the architecture of a conventional solid state storage device.
Figure 2A:
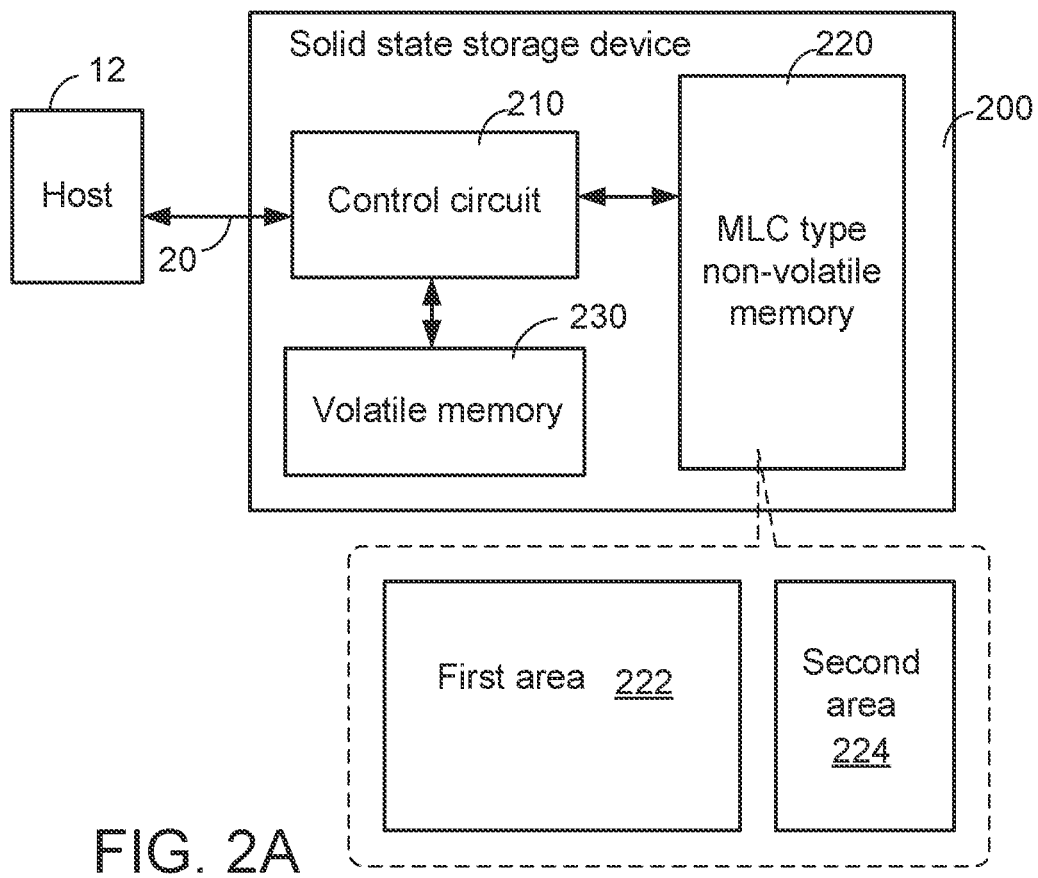
FIG. 2A is a schematic diagram illustrating the architecture of a solid state storage device according to an embodiment of the present invention.

Please refer to FIG. 2A. FIG. 2A is a schematic diagram illustrating the architecture of a solid state storage device according to an embodiment of the present invention. The solid state storage device 200 comprises a control circuit 210, a volatile memory 230 and a multi-level cell (MLC) type non-volatile memory 220. The control circuit 210 is connected to the volatile memory 230 and the MLC type non-volatile memory 220. For example, the volatile memory 230 is a dynamic random access memory (DRAM) or a static random access memory (SRAM). That is, when the system is powered off, the contents stored in the volatile memory 230 are lost.

The control circuit 210 is in communication with a host 12 through an external bus 20. Consequently, commands and data can be exchanged between the control circuit 210 and the host 12. For example, the external bus 20 is a USB bus, a SATA bus, a M.2 bus, a PCIe bus, or the like. The volatile memory 230 can be directly installed in the control circuit 210.

In an embodiment, the MLC type non-volatile memory 220 is divided into a first area 222 and a second area 224. The first area 222 comprises plural buffering blocks. The second area 224 comprises plural storing blocks. Moreover, the buffering block of the first area 222 is regarded as a single-level cell (SLC) block by the control circuit 210. The write data is stored into the buffering blocks of the first area 222 in an SLC write mode. The storing block of the second area 224 is regarded as a multi-level cell (MLC) block by control circuit 210. The write data is stored into the storing blocks of the second area 224 in an MLC write mode.

Figure 2B:
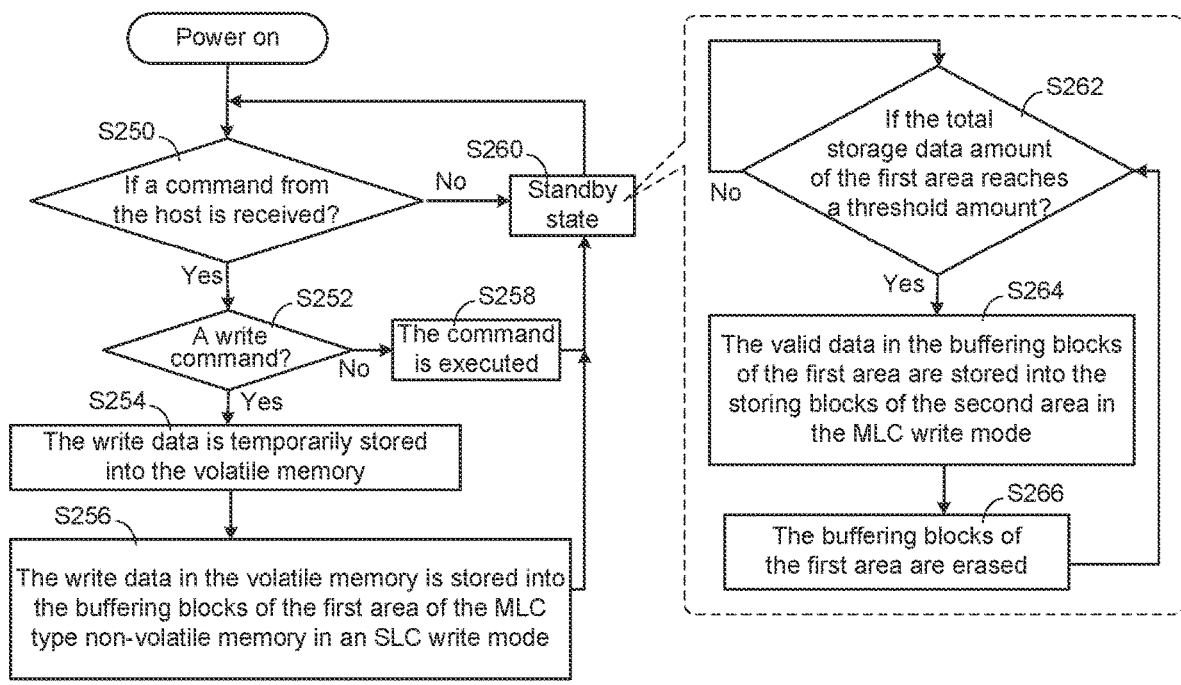
FIG. 2B is a flowchart of a write control method for a solid state storage device according to a first embodiment of the present invention.

FIG. 2B is a flowchart of a write control method for a solid state storage device according to a first embodiment of the present invention. After the system is powered on, the solid state storage device 200 is enabled. After the system is powered off, the solid state storage device 200 is disabled.

When the solid state storage device 200 is enabled, the control circuit 210 judges whether a command from the host 12 is received (Step S250). If the control circuit 210 judges that no command from the host 12 is received, the solid state storage device 200 is in a standby state (Step S260) until the control circuit 210 receives the command from the host 12.

If the judging result of the step S250 indicates that the command from the host 12 is received, the control circuit 210 judges whether the command from the host 12 is a write command (Step S252). If the command is not the write command, the control circuit 210 executes the command (Step S258). After the step S258, enter the step S260. For example, if the command from the host 12 is a read command, the control circuit 210 acquires the read data from the MLC type non-volatile memory 220 and transmits the read data to the host 12.

If the judging result of the step S252 indicates that the command from the host 12 is a write command, the write data from the host 12 is temporarily stored into the volatile memory 230 (Step S254). Then, the write data in the volatile memory 230 is stored into the buffering blocks of the first area 222 of the MLC type non-volatile memory 220 in an SLC write mode by the control circuit 210 (Step S256), and then enter the step S260.

As mentioned above, the solid state storage device 200 comprises the MLC type non-volatile memory 220. In the first embodiment, the write data is stored into the buffering blocks of the first area 222 of the MLC type non-volatile memory 220 in the SLC write mode by the control circuit 210. Consequently, the writing performance of the solid state storage device 200 is largely enhanced.

After the write data is stored into the buffering blocks of the first area 222 in the SLC write mode, the storage space of the buffering blocks is decreased. For effectively utilizing the storage space of the buffering blocks, the steps Step S262, S264 and S266 are performed when the solid state storage device 200 is in the standby state.

Please refer to FIG. 2B again. When the solid state storage device 200 is in the standby state, the control circuit 210 judges whether the total storage data amount of the first area 222 reaches a threshold amount (Step S262).

If the judging result of the step S262 indicates that the total storage data amount of the first area 222 does not reach the threshold amount, it means that the number of the buffering blocks of the first area 222 is sufficient. Consequently, no measure needs to be taken, and the solid state storage device 200 is maintained in the standby state.

Whereas, if the judging result of the step S262 indicates that the total storage data amount of the first area 222 reaches the threshold amount, the control circuit 210 performs a garbage collection on the first area 222. For performing the garbage collection, the steps S264 and S266 are performed sequentially. In the step S264, the valid data in the buffering blocks of the first area 222 are stored into the storing blocks of the second area 224 in the MLC write mode. In the step S266, the buffering blocks of the first area 222 are erased. Then, the step S262 is repeatedly done, and the solid state storage device 200 is maintained in the standby state. After the garbage collection is completed, the first area 222 has more available buffering blocks. When the host 12 issues the write command again, the control circuit 210 can execute the write command at the better writing performance. In addition, the write data is stored into the first area 222 in the SLC write mode.

From the above descriptions, the control circuit 210 is operated in a first write mode to execute the write command. Consequently, the write data is stored into the first area 222 of the MLC type non-volatile memory 220. When the garbage collection is performed on the first area 222, the control circuit 210 is operated in a second write mode. Consequently, the valid data in the first area 222 are stored into the second area 224 of the MLC type non-volatile memory 220. The first write mode is the SLC write mode. The second write mode is the MLC mode. In other words, the write speed in the first write mode is faster than the write speed in the second write mode.

FIGS. 3A~3D schematically illustrate the operation of the write control method for the MLC type non-volatile memory according to the first embodiment of the present invention.

Figure 3A:
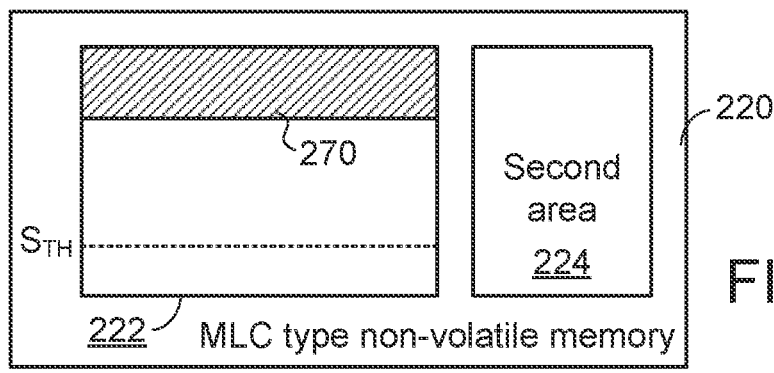
FIGS. 3A~3D schematically illustrate the operation of the write control method for the MLC type non-volatile memory according to the first embodiment of the present invention.

Please refer to FIG. 3A. When the control circuit 210 receives a write command from the host 12, the write data 270 is stored into the buffering blocks of the first area 222 of the MLC type non-volatile memory 220 in an SLC write mode by the control circuit 210. Since the total storage data amount of the first area 222 does not reach the threshold amount $S_{TH}$ indicated by a dashed line, it means that the number of the buffering blocks is sufficient. When the solid state storage device 200 is in the standby state, the control circuit 210 does not perform the garbage collection on the first area 222.

Figure 3B:
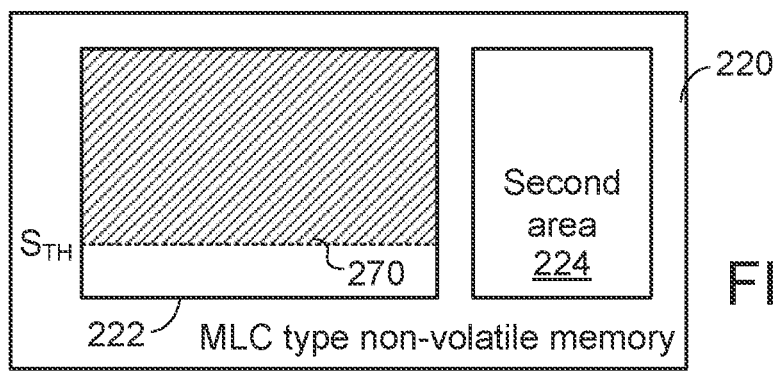

Please refer to FIG. 3B. The write data 270 is stored into the buffering blocks of the first area 222 of the MLC type non-volatile memory 220 by the control circuit 210. At this time, the total storage data amount of the first area 222 reaches the threshold amount $S_{TH}$. In other words, the number of the buffering blocks is not sufficient.

Figure 3C:
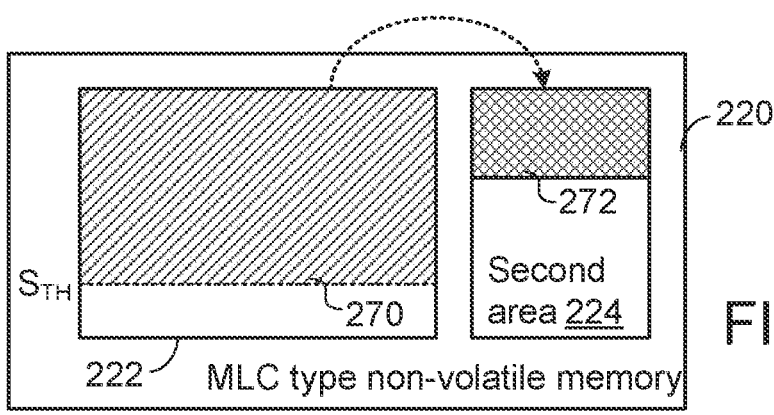

Please refer to FIG. 3C. When the solid state storage device 200 is in the standby state, the control circuit 210 performs the garbage collection on the first area 222. Meanwhile, the valid data in the buffering blocks of the first area 222 are stored into the storing blocks of the second area 224 in the MLC write mode by the control circuit 210. Since the storage data amount of one storing block is plural times the storage data amount of one buffering block, the control circuit 210 uses a smaller number of storing blocks to store the valid data 272. For example, while the garbage collection is performed on the first area 222, the valid data in M buffering blocks of the first area 222 are stored into N storing blocks of the second area 224 by the control circuit 210, wherein N is smaller than or equal to M/x, wherein x is larger than 1. Moreover, x is determined according to the number of bits storable in each memory cell of the second area 224. For example, in case that each memory cell of the second area 224 is able to store 3 bits, x is equal to 3.

Figure 3D:
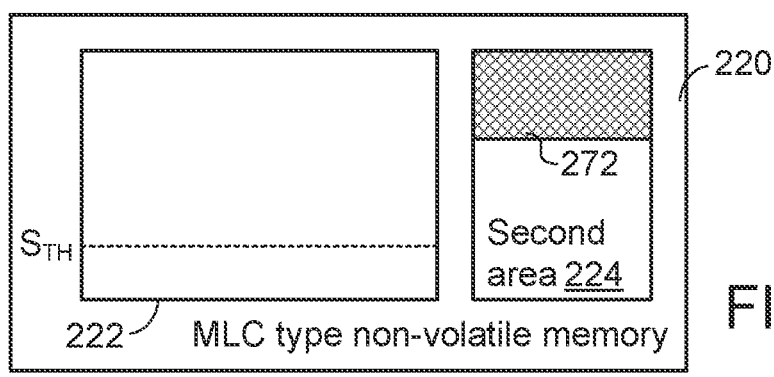

Please refer to FIG. 3D. Then, the write data 270 in the buffering blocks of the first area 222 is erased by the control circuit 210. Consequently, the number of the available buffering blocks in the first area 222 is increased.

As mentioned above, the MLC type non-volatile memory 220 of the solid state storage device 200 is divided into the first area 222 and the second area 224. The write data is stored into the buffering blocks of the first area 222 of the MLC type non-volatile memory 220 in the SLC write mode. Then, in the standby state, the garbage collection may be performed on the first area 222. While the garbage collection is performed, the valid data in the buffering block of the first area 222 are stored into the storing blocks of the second area 224 in the MLC write mode. Consequently, when the write command is executed by the solid state storage device 200, the writing performance of the solid state storage device 200 can be largely increased.

In the above embodiment, the size of the first area 222 in the MLC type non-volatile memory 220 is fixed, and the write data is stored into the first area 222 in the SLC write mode. Due to this design, the actual data storage amount of the MLC type non-volatile memory 220 is decreased. For example, it is assumed that the MLC type non-volatile memory 220 has a storage capability of 256 GByte and comprises 2048 blocks. In case that each memory cell can store three bits, each block can store the data with a size of 128 Mbyte in the MLC write mode. That is, the MLC non-volatile memory 220 can store the data with a total size of 256 Gbyte (=128 Mbyte×2048).

For example, in the 2048 blocks, 1500 blocks are used as the buffering blocks, and the other blocks (e.g., 548 blocks) are used as the storing blocks. Under this circumstance, each storing block can store the data with a size of 128 Mbyte, and each buffering block can store the data with a size of (128/3) Mbyte. Consequently, the actual storage data amount of the MLC non-volatile memory 220 is decreased to about 128 GByte (=⅓×1500×128 Mbyte+548×128 Mbyte). That is, the first area 222 can store the data with the size of about 64 GMbyte, and the second area 224 can store the data with a size of about 64 GMbyte. Under this circumstance, the actual storage data amount of the MLC non-volatile memory 220 is reduced to one half of the original storage data amount.

In case that the host 12 provides a great number of consecutive write data, the use of the write control method of the first embodiment may decrease the writing performance of the solid state storage device 200. For example, if the user intends to store a 100 GByte movie file into the solid state storage device 200, a great number of consecutive write data with a total size of 100 GByte are provided to the solid state storage device 200 after the host 12 issues the write command.

Generally, the solid state storage device 200 is unable to realize the amount of the write data to be transmitted from the host 12. Initially, the write data is stored into the buffering blocks of the first area 222 of the MLC type non-volatile memory 220 in the SLC write mode by the control circuit 210, and the writing performance of the solid state storage device 200 is high enough. However, when the amount of the consecutive write data is close to 64 GByte (i.e., close to the upper limit of the data storage amount of the first area 222), there is no blank buffering blocks in the first area 222 for storing the write data therein. At this time, the write action needs to be temporarily stopped by the control circuit 210, and the garbage collection needs to be performed on the first area 222 immediately. After the garbage collection is completed, new blank buffering blocks in the first area 222 are generated. From now on, the store data can be stored into the buffering blocks of the first area 222 of the MLC type non-volatile memory 220 in the SLC write mode by the control circuit 210. Since the process of performing the garbage collection is time-consuming, the writing performance of the solid state storage device 200 is largely reduced.

Figure 4:
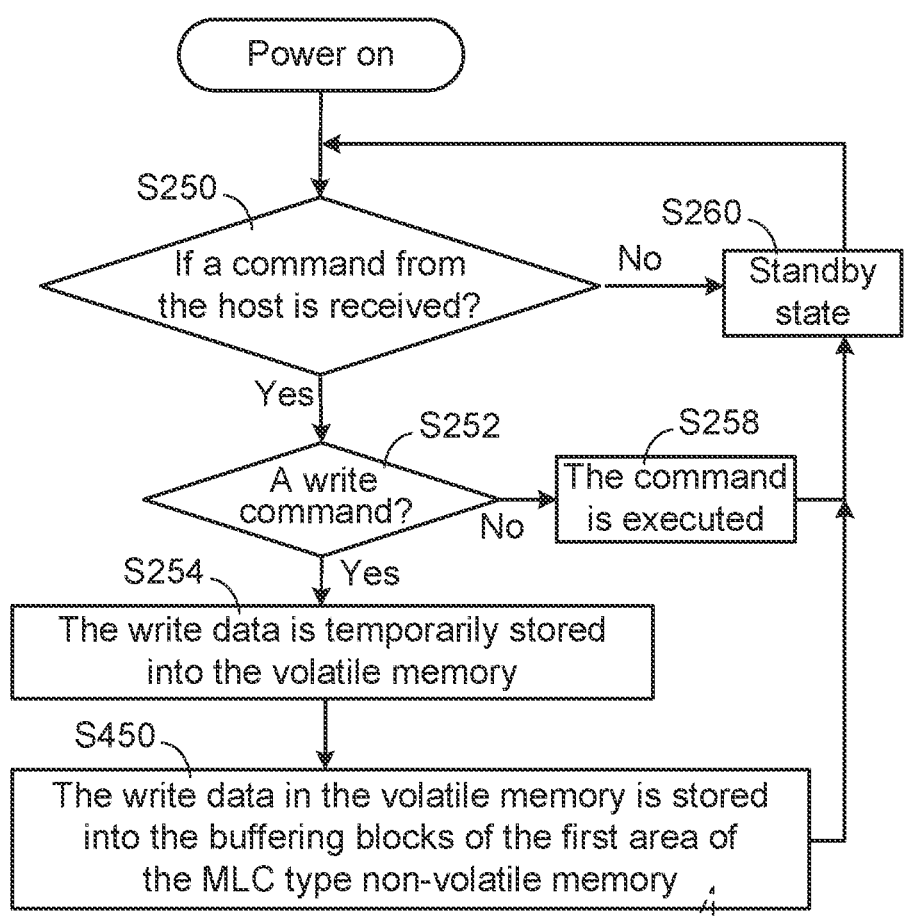
FIG. 4 is a flowchart of a write control method for a solid state storage device according to a second embodiment of the present invention.

FIG. 4 is a flowchart of a write control method for a solid state storage device according to a second embodiment of the present invention. The write control method of the second embodiment can be also applied to the solid state storage device 200 as shown in FIG. 2A.

When the solid storage device 200 is enabled, the control circuit 210 judges whether a command from the host 12 is received (Step S250). If the control circuit 210 judges that no command from the host 12 is received, the solid state storage device 200 is in a standby state (Step S260) until the control circuit 210 receives the command from the host 12. Similarly, when the solid state storage device 200 is in the standby state (Step S260), the garbage collection is performed on the first area 222 by the control circuit 210. The associated operations are similar to the steps S262, S264 and S266 as shown in FIG. 2B, and not described herein.

If the judging result of the step S250 indicates that the command from the host 12 is received, the control circuit 210 judges whether the command from the host 12 is a write command (Step S252). If the command is not the write command, the control circuit 210 executes the command (Step S258). After the step S258, enter the step S260. For example, if the command from the host 12 is a read command, the control circuit 210 acquires the read data from the MLC type non-volatile memory 220 and transmits the read data to the host 12.

If the judging result of the step S252 indicates that the command from the host 12 is the write command, the write data from the host 12 is temporarily stored into the volatile memory 230 (Step 254). Then, the write data in the volatile memory 230 is stored into the buffering blocks of the first area 222 of the MLC type non-volatile memory 220 by the control circuit 210 (Step S450), and then enter the step S260.

While the step S450 is performed, the control circuit 210 monitors the amount of the write data continuously stored into the MLC type non-volatile memory 220. If the amount of the write data continuously stored into the MLC type non-volatile memory 220 does not reach a predetermined amount (Step S452), the write data is stored into the buffering blocks of the first area 222 of the MLC type non-volatile memory 220 in an SLC write mode by the control circuit 210 (Step S454). Whereas, if the amount of the write data continuously stored into the MLC type non-volatile memory 220 reaches the predetermined amount (Step S452), the write data is stored into the storing blocks of the second area 224 of the MLC type non-volatile memory 220 in an MLC write mode by the control circuit 210 (Step S456).

Especially, the control circuit 210 can selectively perform the write control method of the first embodiment or the write control method of the second embodiment according to the result of judging whether there is a great number of consecutive write data.

For example, if the judges that a great number of consecutive write data are not provided according to plural write commands from the host 12, the control circuit 210 performs the flowchart of the write control method as shown in FIGS. 3A~3D. That is, the write data is stored into the buffering blocks of the first area 222 of the MLLC type non-volatile memory 220 in the SLC write mode by the control circuit 210. When the total storage amount of the first area 222 reaches the threshold amount $S_{TH}$ and the solid state storage device 200 is in the standby state, the control circuit 210 performs the garbage collection on the first area 222.

Figure 5A:
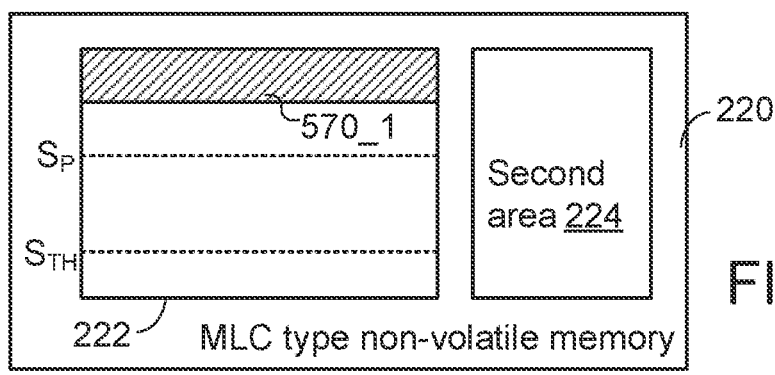
FIGS. 5A and 5B schematically illustrate the operation of the write control method for the MLC type non-volatile memory according to the second embodiment of the present invention.
Figure 5B:
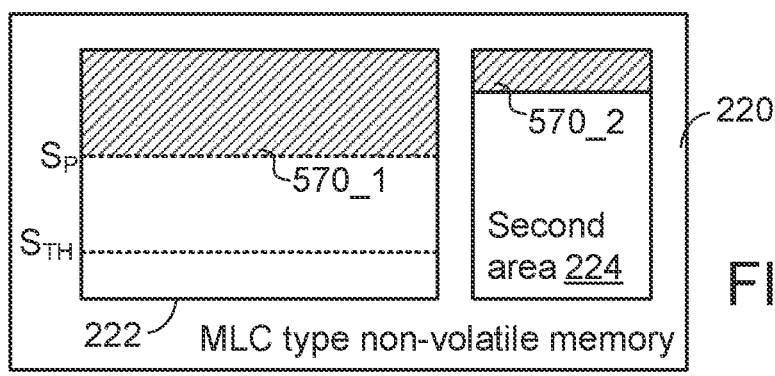

Whereas, if the control circuit 210 judges that the host 12 provides a great number of consecutive write data, the control circuit 210 performs the flowchart of the write control method as shown in FIGS. 5A and 5B. FIGS. 5A and 5B schematically illustrate the operation of the write control method for the MLC type non-volatile memory according to the second embodiment of the present invention. As shown in FIG. 5A, the amount of the write data continuously stored into the MLC type non-volatile memory 220 does not reach the predetermined amount $S_P$. When the control circuit 210 receives the write command from the host 12, the write data 570_1 is stored into the buffering blocks of the first area 222 of the MLC type non-volatile memory 220 in a first write mode by the control circuit 210. The first write mode is the SLC write mode. In addition, the predetermined amount $S_P$ is smaller than the threshold amount $S_{TH}$.

Please refer to FIG. 5B. At this time, the amount of the write data continuously stored into the MLC type non-volatile memory 220 reaches the predetermined amount $S_P$. When the control circuit 210 receives the write command from the host 12, the write data 570_2 is stored into the storing blocks of the second area 224 of the MLC type non-volatile memory 220 in a second write mode by the control circuit 210. The second write mode is the MLC write mode. In other words, the write speed in the first write mode is faster than the write speed in the second write mode.

For example, it is assumed that the predetermined amount $S_P$ is 10 GByte, and the amount of the write data provided by the host 12 is 30 GByte. While the write data is stored into the MLC type non-volatile memory 220, the control circuit 210 monitors the amount of the write data continuously stored into the MLC type non-volatile memory 220. Before the amount of the write data continuously stored into the MLC type non-volatile memory 220 reaches 10 GByte, the write data is stored into the buffering blocks of the first area 222 of the MLC type non-volatile memory 220 in the SLC write mode by the control circuit 210. After the amount of the write data continuously stored into the MLC type non-volatile memory 220 reaches 10 GByte, the remaining write data with the size of 20 GByte is stored into the storing blocks of the second area 224 of the MLC type non-volatile memory 220 in the MLC write mode by the control circuit 210.

As mentioned above, the control circuit 210 is unable to realize the amount of the write data to be transmitted from the host 12. If the host 12 provides a great number of consecutive write data, the storage spaces of in the storing blocks of the second area 224 will be exhausted and the writing performance will be largely reduced. The write control method of the second embodiment can overcome this drawback. The control circuit 210 monitors the amount of the write data continuously stored into the MLC type non-volatile memory 220. When the amount of the write data continuously stored into the MLC type non-volatile memory 220 reaches the predetermined amount $S_P$, the remaining write data is stored into the storing blocks of the second area 224 of the MLC type non-volatile memory 220 in the MLC write mode by the control circuit 210. In this way, the writing performance of the solid state storage device 200 is not largely reduced. That is, the writing performance of the solid state storage device 200 is still acceptable.

It is noted that numerous modifications and alterations may be made while retaining the teachings of the invention. In order to increase the actual storage space of the MLC type non-volatile memory 220, the write control method of the present invention further provides a function of dynamically adjusting the size of the first area 222 and the size of the second area 224. For example, after the control circuit 210 performs the garbage collection on the first area 222, the control circuit 210 adjusts the size of the first area 222 and the size of the second area 224 according to the number of the available blocks. For example, 70% of the available blocks are assigned to the first area 222 as the buffering blocks, and 30% of the available blocks are assigned to the second area 224 as the storing blocks. As the data storage amount of the MLC non-volatile memory 220 is gradually increased, the control circuit 210 may dynamically decrease the size of the first area 222. Consequently, the actual data storage amount of the MLC type non-volatile memory 220 is increased. In this context, the available blocks denote the blocks that can be used to store the write data. For example, the available blocks include the blank blocks, the blocks storing invalid data only and/or the blocks to be erased.

From the above descriptions, the present invention provides a solid state storage device and a write control method for the solid state storage device. By using the write control method of the present invention, the write data can be stored into the MLC type non-volatile memory at a proper write speed. Moreover, when the host provides a great number of consecutive write data, the writing performance of the solid state storage device is not largely reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A solid state storage device connected with a host, the solid state storage device comprising:
    a control circuit connected with the host;
    a volatile memory connected with the control circuit; and
    a non-volatile memory connected with the control circuit,
        wherein the non-volatile memory is divided into a first area and a second area,
    wherein after the host issues a write command and a write data, the control circuit monitors a data amount of the write data continuously stored into the non-volatile memory,
    wherein before the data amount of the write data continuously stored into the non-volatile memory reaches a predetermined amount, the write data is stored into plural buffering blocks of the first area in a first write mode, wherein after the data amount of the write data continuously stored into the non-volatile memory reaches the predetermined amount, the write data is stored into plural storing blocks of the second area in a second write mode,
    wherein a write speed in the first write mode is faster than a write speed in the second write mode,
    wherein when a total storage amount of the first area reaches a threshold amount, the control circuit performs a garbage collection on the first area, wherein the predetermined amount is smaller than the threshold amount.

2. The solid state storage device as claimed in claim 1, wherein the non-volatile memory is a multi-level cell type non-volatile memory, the first write mode is a single-level cell write mode, and the second write mode is a multi-level cell write mode.

3. The solid state storage device as claimed in claim 1, wherein after the control circuit performs a garbage collection on the first area, the control circuit adjusts a size of the first area and a size of the second area according to a number of available blocks in the non-volatile memory, wherein the available blocks are blocks for the control circuit to selectively store the write data therein.

4. The solid state storage device as claimed in claim 1, wherein after the host issues the write command, the write data is temporarily stored into the volatile memory, and then the write data in the volatile memory is stored into the non-volatile memory by the control circuit.

5. A write control method for a solid state storage device, the solid state storage device comprising a volatile memory and a non-volatile memory, the non-volatile memory being divided into a first area and a second area, the write control method comprising steps of:

(a) the solid state storage device being in a standby state when no command from a host is received;

(b) when a write command from the host is received, temporarily storing a write data from the host into the volatile memory; and (c) storing the write data from the volatile memory into the non-volatile memory, and performing the step (a) again, wherein the step (c) comprises sub-steps of:

(c1) monitoring a data amount of the write data continuously stored into the non-volatile memory;

(c2) before the data amount of the write data continuously stored into the non-volatile memory reaches a predetermined amount, storing the write data into plural buffering blocks of the first area in a first write mode; and (c3) after the data amount of the write data continuously stored into the non-volatile memory reaches the predetermined amount, storing the write data into plural storing blocks of the second area in a second write mode, wherein a write speed in the first write mode is faster than a write speed in the second write mode.

6. The write control method as claimed in claim 5, wherein when the solid state storage device is in the standby state, the step (a) comprises sub-steps of:

(a1) judging whether a total storage amount of the first area reaches a threshold amount;

(a2) if the total storage amount of the first area does not reach the threshold amount, the solid state storage device being maintained in the standby state; and (a3) if the total storage amount of the first area reaches the threshold amount, performing a garbage collection on the first area, wherein after the garbage collection is completed, the solid state storage device is in the standby state, wherein the predetermined amount is smaller than the threshold amount.

7. The write control method as claimed in claim 6, wherein while the garbage collection is performed, the step (a3) comprises sub-steps of:

(a31) allowing valid data in the plural buffering blocks of the first area to be stored into the plural storing blocks of the second area in the second write mode; and (a32) erasing the plural buffering blocks of the first area.

8. The write control method as claimed in claim 6, further comprising a step of adjusting a size of the first area and a size of the second area according to a number of available blocks in the non-volatile memory after the garbage collection is performed on the first area.

9. The write control method as claimed in claim 5, wherein the non-volatile memory is a multi-level cell type non-volatile memory, the first write mode is a single-level cell write mode, and the second write mode is a multi-level cell write mode.

* * * * *